(12) United States Patent
Weimer

(10) Patent No.: US 7,470,583 B2
(45) Date of Patent: Dec. 30, 2008

(54) METHOD OF IMPROVED HIGH K DIELECTRIC-POLYSILICON INTERFACE FOR CMOS DEVICES

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 11/358,524

(22) Filed: Feb. 21, 2006

(65) Prior Publication Data

US 2006/0141698 A1   Jun. 29, 2006

Related U.S. Application Data

(62) Division of application No. 09/941,827, filed on Aug. 29, 2001, now Pat. No. 7,129,128.

(51) Int. Cl.
*H01L 21/8242* (2006.01)

(52) U.S. Cl. ............... 438/239; 438/769; 257/E21.664

(58) Field of Classification Search ............ 438/3, 438/239–240, 255, 769, 770, 775, 786; 257/E21.396, 257/E21.664
See application file for complete search history.

(56) References Cited

U.S. PATENT DOCUMENTS

| | | | |
|---|---|---|---|
| 5,464,783 A | 11/1995 | Kim et al. | |
| 5,634,974 A | 6/1997 | Weimer et al. | |
| 5,688,550 A | 11/1997 | Weimer et al. | |
| 5,759,262 A | 6/1998 | Weimer et al. | |
| 5,962,065 A | 10/1999 | Weimer et al. | |
| 5,963,814 A | 10/1999 | Walker et al. | |
| 6,033,998 A | 3/2000 | Aronowitz et al. | |
| 6,063,698 A | 5/2000 | Tseng et al. | |
| 6,087,229 A | 7/2000 | Aronowitz et al. | |
| 6,124,164 A | 9/2000 | Al-Shareef et al. | |
| 6,146,959 A | 11/2000 | DeBoer et al. | |
| 6,162,744 A | 12/2000 | Al-Shareef et al. | |
| 6,198,124 B1 | 3/2001 | Sandhu et al. | |
| 6,207,587 B1 | 3/2001 | Li et al. | |
| 6,218,256 B1 * | 4/2001 | Agarwal | 438/393 |
| 6,235,571 B1 | 5/2001 | Doan | |
| 6,238,964 B1 | 5/2001 | Cho | |
| 6,245,652 B1 | 6/2001 | Gardner et al. | |
| 6,245,689 B1 | 6/2001 | Hao et al. | |

(Continued)

FOREIGN PATENT DOCUMENTS

JP     62002563     1/1997

*Primary Examiner*—Thanhha Pham
(74) *Attorney, Agent, or Firm*—Whyte Hirschboeck Dudek SC

(57) ABSTRACT

Methods for forming dielectric layers over polysilicon substrates, useful in the construction of capacitors and other semiconductor circuit components are provided. A self-limiting nitric oxide (NO) anneal of a polysilicon layer such as an HSG polysilicon capacitor electrode, at less than 800° C., is utilized to grow a thin oxide (oxynitride) layer of about 40 angstroms or less over the polysilicon layer. The NO anneal provides a nitrogen layer at the polysilicon-oxide interface that limits further oxidation of the polysilicon layer and growth of the oxide layer. The oxide layer is exposed to a nitrogen-containing gas to nitridize the surface of the oxide layer and reduce the effective dielectric constant of the oxide layer. The process is particularly useful in forming high K dielectric insulating layers such as tantalum pentoxide over polysilicon. The nitridized oxynitride layer inhibits oxidation of the underlying polysilicon layer in a post-treatment oxidizing anneal of the high K dielectric, thus maintaining the oxide layer as a thin layer over the polysilicon layer.

25 Claims, 3 Drawing Sheets

U.S. PATENT DOCUMENTS

| | | |
|---|---|---|
| 6,278,166 B1 | 8/2001 | Ogle, Jr. |
| 6,291,868 B1 | 9/2001 | Weimer et al. |
| 6,362,086 B2 | 3/2002 | Weimer et al. |
| 6,410,968 B1 | 6/2002 | Powell et al. |
| 6,475,883 B2 | 11/2002 | Powell et al. |
| 6,548,368 B1 | 4/2003 | Narwankar et al. |
| 6,893,979 B2 | 5/2005 | Khare et al. |
| 2001/0024853 A1 | 9/2001 | Wallace et al. |

\* cited by examiner

METHOD OF IMPROVED HIGH K DIELECTRIC-POLYSILICON INTERFACE FOR CMOS DEVICES

CROSS-REFERENCE TO RELATED APPLICATION

This application is a divisional of U.S. patent application Ser. No. 09/941,827, filed Aug. 29, 2001.

FIELD OF THE INVENTION

The present invention relates generally to semiconductor fabrication and, more particularly, to dielectric layers used in semiconductor fabrication, and to methods of forming capacitors and semiconductor circuit components.

BACKGROUND OF THE INVENTION

The continuing trend in integrated circuits toward densification has led to reduced device dimensions and a decrease in size of components that make up the devices. However, in the fabrication of such devices as MOS transistors (metal-oxide semiconductors, or MIS or metal-insulating semiconductors), and with the trend toward higher performance and processing speeds, storage cells must maintain a minimum storage charge to ensure operation of memory cells. Several techniques have been developed to increase the storage capacity of a capacitor within a limited space. For example, surface area has been increased by forming the capacitor in a trench or as a stacked structure. The surface area of the capacitor has also been achieved by increasing the surface roughness of the lower electrode that forms the storage node.

Other techniques concentrate on the use of dielectric materials having high dielectric constants (k). Such materials include tantalum pentoxide ($Ta_2O_5$), titanium dioxide ($TiO_2$), and barium strontium titanate (BST). Such materials effectively possess dielectric constants greater than conventional dielectrics (e.g., silicon oxides and nitrides). Due to the high dielectric constant of $Ta_2O_5$ and other high K dielectrics, a thicker dielectric layer can be used in capacitor constructions to achieve the same capacitance level as thinner layers of other lower K dielectric materials, thus reducing cell leakage for the same effective oxide thickness (EOT).

Despite the advantages of high dielectric constant materials, difficulties have been encountered, however, in incorporating insulating inorganic metal oxide materials into semiconductor fabrications. Typically, the deposition of the dielectric layer and a subsequent anneal to densify the high K dielectric material to reduce leakage is conducted in the presence of an oxygen ambient. Undesirably, the oxygen ambient will react with the underlying lower capacitor plate, typically conductively doped polysilicon, to form a layer of silicon dioxide over the polysilicon that reduces the overall dielectric constant and thereby reduces the cell capacitance.

One solution that has been utilized is to provide an intervening oxidation barrier layer between the inorganic metal oxide dielectric layer and the underlying polysilicon electrode. Present methods include forming a silicon nitride layer over the polysilicon prior to formation of the $Ta_2O_5$ or other dielectric layer, by rapid thermal nitridization (RTN) of the polysilicon electrode. The nitride layer is used to reduce the oxidation of the lower polysilicon electrode during the deposition of the dielectric layer and subsequent oxidation and conditioning treatments. The subsequent treatment processes invariably oxidize the underlying polysilicon electrode to reduce the leakage of the dielectric-polysilicon stack. However, the overall capacitance is undesirably reduced due to the physical thickness of the subsequent oxynitride layer, which is typically up to 30 angstroms.

Thus, a need exists for a process for integrating high dielectric constant materials into semiconductor devices that avoids such problems.

SUMMARY OF THE INVENTION

The present invention provides methods for forming dielectric layers over polysilicon substrates and in the construction of semiconductor devices, methods for forming capacitors and other semiconductor devices, and semiconductor devices and capacitor structures.

It is recognized that the lower polysilicon electrode of a capacitor construction should become oxidized to some degree during processing for reduction of cell leakage. The present invention utilizes a self-limiting oxynitride layer to achieve polysilicon oxidation, and as an interface layer prior to deposition of $Ta_2O_5$ or other dielectric layer. The process flow of the invention utilizing a self-limiting nitric oxide (NO) anneal of the polysilicon layer at less than 800° C. to grow a thin oxide (oxynitride) layer of about 40 angstroms or less, preferably less than 15 angstroms, over the polysilicon layer. The anneal results in the formation of a layer of nitrogen at the polysilicon-oxide interface that inhibits oxygen diffusion through the oxide layer to the underlying polysilicon, thus inhibiting further oxidation of the polysilicon layer and additional growth of the oxide layer. The oxide layer is then annealed, preferably plasma annealed, in a nitrogen-containing ambient to nitridize the surface of the oxide layer, resulting in layer of silicon nitride ($SiN_x$) formed over the oxide layer. The silicon nitride layer reduces the effective dielectric constant of the oxide layer.

Advantageously, the thickness of an oxide layer grown over polysilicon with nitric oxide and overlain with tantalum pentoxide or other high K dielectric that is subsequently reoxidized is less than the thickness of an oxide layer grown over polysilicon by conventional RTN with a reoxidized high K dielectric layer. By use of the present invention, a post-treatment oxidation anneal of a high K dielectric layer will not oxidize the underlying polysilicon layer to any substantial degree.

In addition, the process of the invention results in reduced electrical thickness of the interface layer in a capacitor construction, and thus increased capacitance without adversely affecting the leakage (defectivity) of the stack. The present process achieves more capacitance with the same or reduced leakage (cell defects). The process further provides reduced Dt of the entire process flow by replacing the conventional 750° C. anneal in nitrous oxide ($N_2O$) for crystallization of the dielectric (e.g., $Ta_2O_5$) layer with a shorter 700 to 750° C. anneal of the polysilicon layer in nitric oxide (NO).

In one aspect, the invention provides methods for forming a dielectric layer over a polysilicon substrate. The polysilicon substrate is annealed in nitric oxide (NO) to form an oxide (oxynitride) layer, the oxide layer is nitridized to form a nitride layer, and the dielectric layer is deposited onto the nitride layer. In one embodiment of the method, the polysilicon substrate such as HSG polysilicon, is annealed in nitric oxide at a temperature of less than 800° C., preferably about 700° C. to about 750° C. to form an oxynitride layer, preferably an active nitrogen-containing species formed in a plasma, of about 40 angstroms or less, preferably less than 15 angstroms. The oxynitride layer is then exposed to a nitrogen-containing gas, preferably a plasma source of nitrogen, to form a silicon nitride layer over the surface. A high K dielectric layer such as tantalum pentoxide ($Ta_2O_5$) is then formed over the nitride layer, and annealed in an oxidizing gas. The thickness of the oxynitride layer remains substantially the same as before the oxidizing anneal of the dielectric layer.

In another aspect, the invention provides methods for forming a semiconductor device above a semiconducting substrate. In one embodiment of the method, an oxynitride layer is formed over a polysilicon substrate by annealing the polysilicon substrate in the presence of a nitric oxide, preferably at a temperature of less than 800° C. to form an oxide layer of about 40 angstroms or less with a preferred thickness of less than 15 angstroms; nitridizing the oxide layer in a nitrogen-containing gas; and forming a dielectric layer over the nitrided surface of the oxide layer, preferably with a high K dielectric such as tantalum pentoxide ($Ta_2O_5$) which is then subjected to an oxidizing anneal to condition the material.

In yet another aspect, the invention provides methods for forming a capacitor. In one embodiment of the method, a first capacitor electrode comprising polysilicon is formed over a substrate, an oxide (oxynitride) layer is grown over the first capacitor electrode by annealing the electrode in the presence of a nitric oxide, preferably at a temperature of less than 800° C., to a thickness of about 40 angstroms or less, with a preferred thickness of less than 15 angstroms; the oxide layer is exposed to a nitrogen-containing gas to form a nitride layer over the surface; and a dielectric layer is formed over the nitride layer, preferably using a high K dielectric such as tantalum pentoxide ($Ta_2O_5$) which is then annealed in an oxidizing gas. A conductive second capacitor electrode can then be formed over the dielectric layer.

In another embodiment, a capacitor can be formed by providing a substrate comprising an overlying insulative layer and a container opening formed in the insulating layer to an active area on the substrate and a lower electrode comprising polysilicon formed within the container opening; growing an oxide (oxynitride) layer over the lower electrode to a thickness of about 40 angstroms or less, with a preferred thickness of less than 15 angstroms, by annealing the polysilicon electrode in the presence of nitric oxide; nitridizing the oxide layer in a nitrogen-containing gas; and forming a layer of a dielectric material, preferably a high K dielectric, over the nitridized oxide layer. A conductive upper electrode can then be formed over the dielectric layer.

In another aspect, the invention provides a semiconductor device. In one embodiment, the device comprises an oxynitride layer overlying a polysilicon substrate, the oxynitride layer comprising a nitric oxide grown oxide layer of up to about 40 angstroms, with a preferred thickness of less than 15 angstroms; a layer of silicon nitride overlying the oxynitride layer; and a layer of a dielectric material, preferably a high K dielectric that has been oxygen annealed, overlying the nitride layer.

In yet another aspect, the invention provides a capacitor. In one embodiment, the capacitor comprises a first conductive capacitor plate comprising polysilicon; a thin oxynitride layer overlying the first capacitor plate, the oxynitride layer comprising an oxide layer grown in the presence of nitric oxide, having a thickness of about 40 angstroms or less, preferably less than 15 angstroms; a layer of silicon nitride overlying the oxynitride layer; and a dielectric layer overlying the nitride layer, preferably comprising an oxygen annealed high K dielectric material. Additionally, the capacitor can comprise a second conductive capacitor plate overlying the dielectric layer.

In another embodiment, the capacitor can comprise a container formed in an insulative material such as BPSG, and a lower capacitor electrode comprising polysilicon such as HSG polysilicon formed in the container; an oxide (oxynitride) layer overlying the lower capacitor electrode, and comprising nitric oxide grown oxide of about 40 angstroms or less, preferably less than 15 angstroms thick; a silicon nitride layer over the surface of the oxide layer; and a dielectric layer, preferably an oxidized high K dielectric, overlying the nitride layer. The capacitor can further comprise an upper capacitor electrode overlying the dielectric layer.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1-5, in a method of forming a dielectric layer in the construction of a container capacitor. While the concepts of the invention are conducive to the fabrication of container capacitors, the concepts described herein can be applied to other semiconductor devices that would likewise benefit from the fabrication of a dielectric film as described herein. Therefore, the depiction of the invention in reference to the manufacture of a container capacitor is not meant to limit the extent to which one skilled in the art might apply the concepts taught herein.

Figure 1:
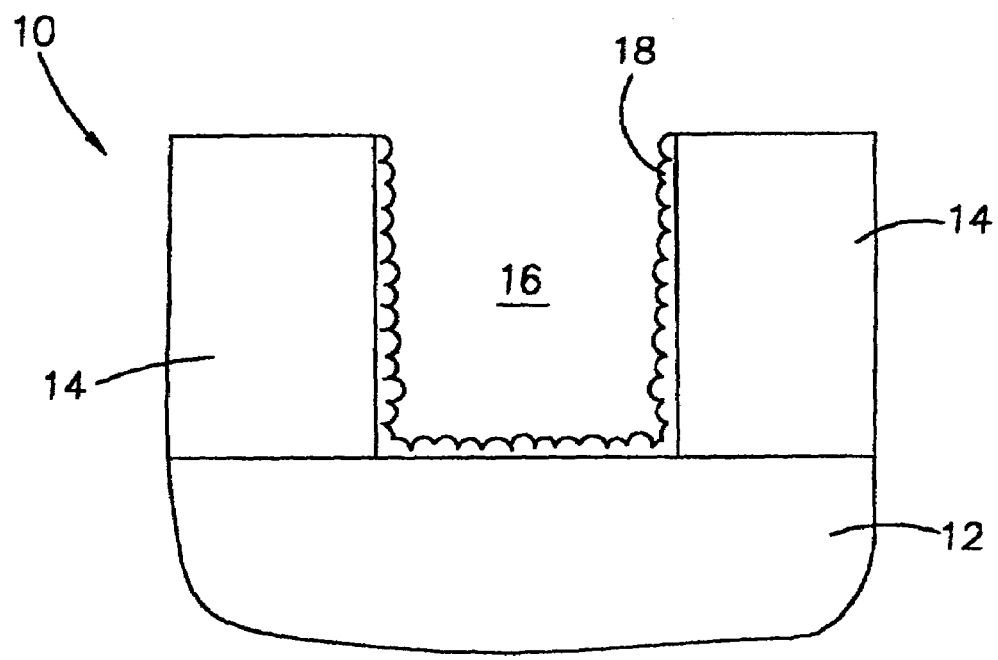
FIG. 1 is a diagrammatic cross-sectional view of a semiconductor wafer fragment at a preliminary step of a processing sequence.

Referring to FIG. 1, a portion of a semiconductor wafer 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as comprising a substrate 12 and an overlying insulation layer 14. An exemplary substrate 12 is monocrystalline silicon that is lightly doped with a conductivity enhancing material. Exemplary insulation materials include silicon dioxide ($SiO_2$), phosphosilicate glass (PSG), borosilicate glass (BSG), and borophosphosilicate glass (BPSG), in a single layer or multiple layers, with the insulation layer 14, being BPSG in the illustrated example. A container or opening 16 has been conventionally etched into the BPSG insulation layer 14.

An electrically conductive material forms a lower capacitor electrode layer 18 that has been formed on the insulative substrate 14 within the opening 16. The electrode layer 18 comprises a semiconductive material such as HSG polysilicon, and undoped or conductively doped polysilicon, being HSG polysilicon in the illustrated example. The electrode layer 18 can be formed by conventional fabrication methods known and used in the art.

Figure 2:
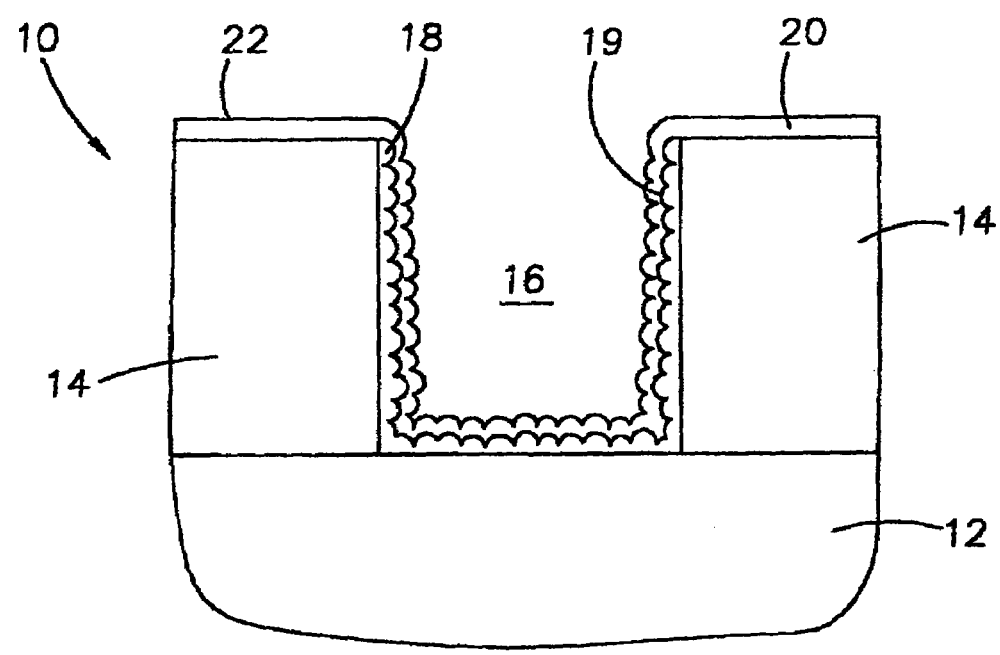
FIGS. 2-5 are views of the wafer fragment of FIG. 1 at subsequent and sequential processing steps, showing fabrication of an capacitor according to an embodiment of the method of the invention.

Referring now to FIG. 2, a thin oxide (oxynitride) layer 20 is thermally grown over the polysilicon electrode layer 18 using a self-limiting anneal of the electrode layer 18 in nitric oxide (NO) gas. As the oxide layer 20 builds up, the underlying polysilicon electrode layer 18 is no longer oxidizable and the nitric oxide ambient thus becomes a self-limiting oxidation ambient. The annealing localizes nitrogen near the interface 19 between the polysilicon layer 18 and the oxide layer 20. The resulting thin nitrogen layer at the polysilicon-oxide interface inhibits diffusion of oxygen through the oxide layer 20 into the underlying polysilicon layer 18, thus preventing further oxidation of the polysilicon layer during subsequent processing steps, i.e., a post-RPN (plasma anneal). A preferred technique for forming the oxide layer 20 is to expose the polysilicon layer 18 to nitric oxide (NO) gas at a temperature of less than 800° C., preferably about 700 to about 750° C., for about 1 to about 3600 seconds, at about 1 mTorr to greater than atmospheric pressure, preferably atmospheric pressure, to grow a thin oxide layer 20 that is about 40 angstroms or less, and preferably less than 15 angstroms.

Figure 3:
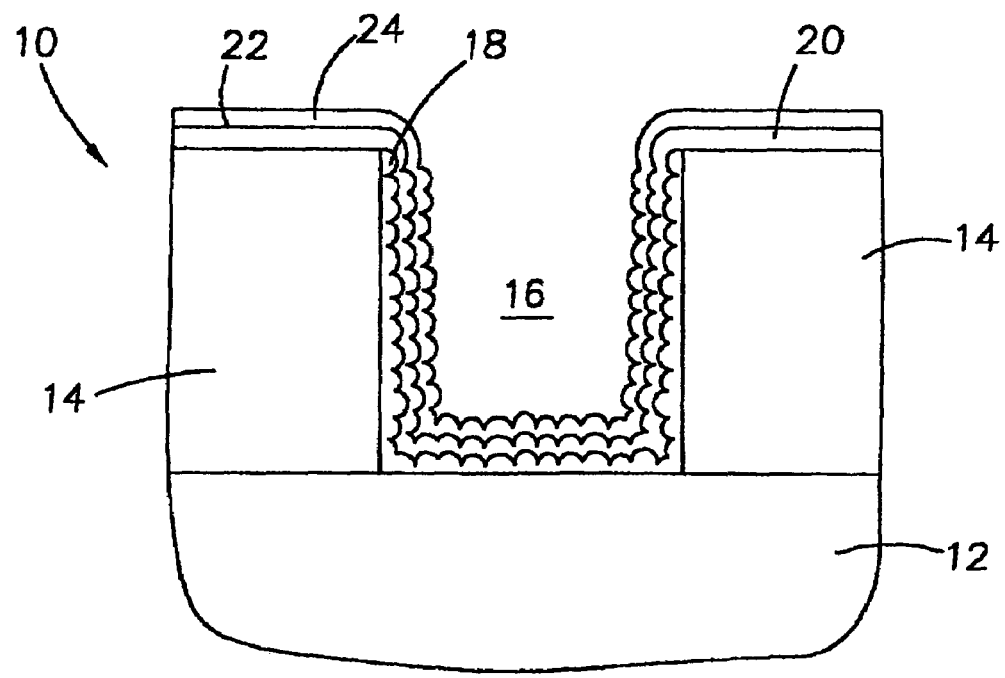

The oxide layer 20 is then exposed to a plasma generated nitrogen species to form a nitrogen-containing layer 24, as shown in FIG. 3. The nitride layer 24 on the surface of the oxide layer 20 reduces the effective dielectric constant of the oxide layer 20. Preferably, the nitride layer 24 is about 5 to about 15 angstroms thick, preferably about 10 angstroms, and the oxide layer 20 and the nitride layer 24 collectively have a physical thickness of about 10 to about 40 angstroms, preferably about 10 to about 30 angstroms, preferably about 15 angstroms.

The nitridizing process step can occur in a rapid thermal processor or, preferably, a plasma reactor such as a high density plasma reactor or remote plasma chamber, typically over a temperature range of about 0 C to about 900° C. Exemplary nitrogen-containing gases include nitrogen ($N_2$), ammonia ($NH_3$), nitrogen ($N_2$) with helium (He), nitrogen ($N_2$) with argon (Ar), nitrogen oxides ($NO_x$) including nitrous oxide and nitric oxide, and mixtures thereof.

A preferred nitridization process comprises exposing the wafer 10 to an remote plasma source of nitrogen, preferably a microwave source, at a temperature of about 350 to about 900° C., a pressure of about 1 mTorr to about 100 Torr, preferably about 1 to about 10 Torr, with a microwave generated plasma in nitrogen ($N_2$) and helium at a He:N ratio of about 4:1, and at a flow rate of the nitrogen-containing gas of about 1 to about 5000 sccm, for about 1 to about 1800 seconds.

Figure 4:
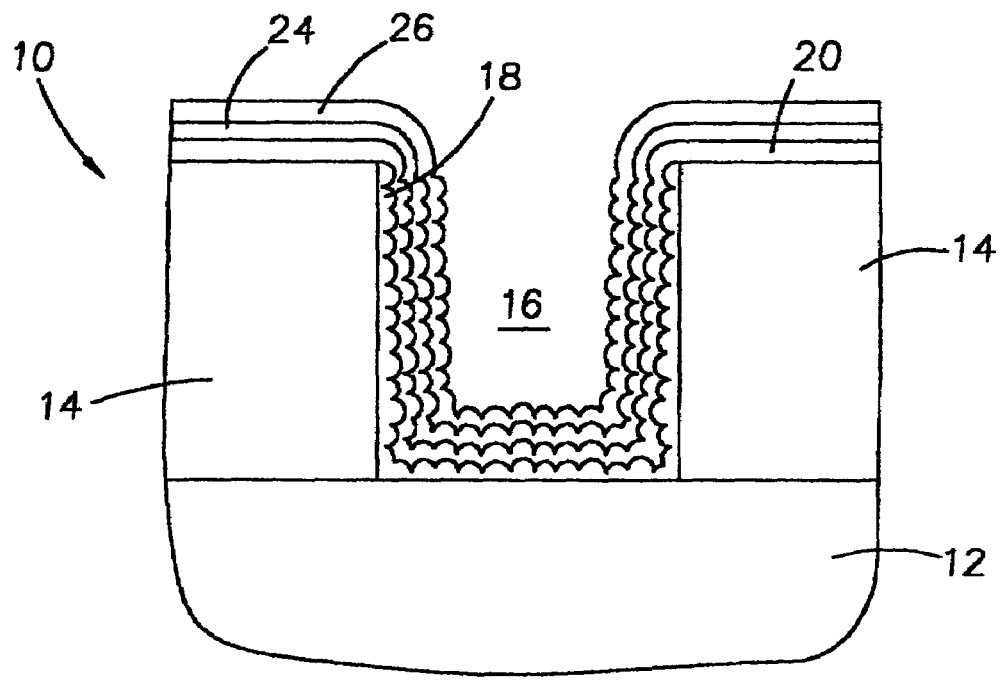

Following nitridization, a dielectric layer 26 is then formed over the nitride layer 24, as depicted in FIG. 4, according to techniques known and used in the art. Preferably, the dielectric layer 26 comprises a high dielectric constant (high K) material. "High K" materials are to be distinguished from conventional dielectric materials such as silicon dioxide (k~3.9). Examples of high K materials for dielectric layer 26 include tantalum pentoxide ($Ta_2O_5$), titanium dioxide ($TiO_2$), barium strontium titanate (BST), strontium titanate (ST), barium titanate (BT), lead zirconium titanate (PZT), strontium bismuth tantalate (SBT), hafnium. oxide ($HfO_2$), zirconium oxide ($ZrO_2$), and aluminum oxide ($Al_2O_3$), being $Ta_2O_5$ in the illustrated example. The dielectric layer 26 can be formed by a variety of techniques known and use in the art such as low pressure chemical vapor deposition (LPCVD), remote plasma deposition, among other techniques.

Subsequently, the high K ($Ta_2O_5$) layer 26 can be subjected to post-treatment processing to reduce leakage and improve its dielectric qualities by saturating the layer 26 with oxygen. Typically, $Ta_2O_5$ is subjected to an anneal in the presence of an oxidizing gas. The oxygen anneal is typically conducted utilizing one or more of oxygen ($O_2$), plasma oxygen, ozone ($O_3$) and nitrous oxide ($N_2O$), with or without plasma excitation.

In a conventional process flow, post-treatment processing of the dielectric layer 26 in an oxygen ambient would undesirably oxidize the underlying polysilicon layer 18. However, the presence of the oxide layer 20 and the silicon oxynitride layer 24 according to the invention, provides the benefit of providing a nitrogen barrier to diffusion of oxygen through the oxide layer 20 to the polysilicon layer 18 during post treatment oxidation of the dielectric layer 26.

Figure 5:
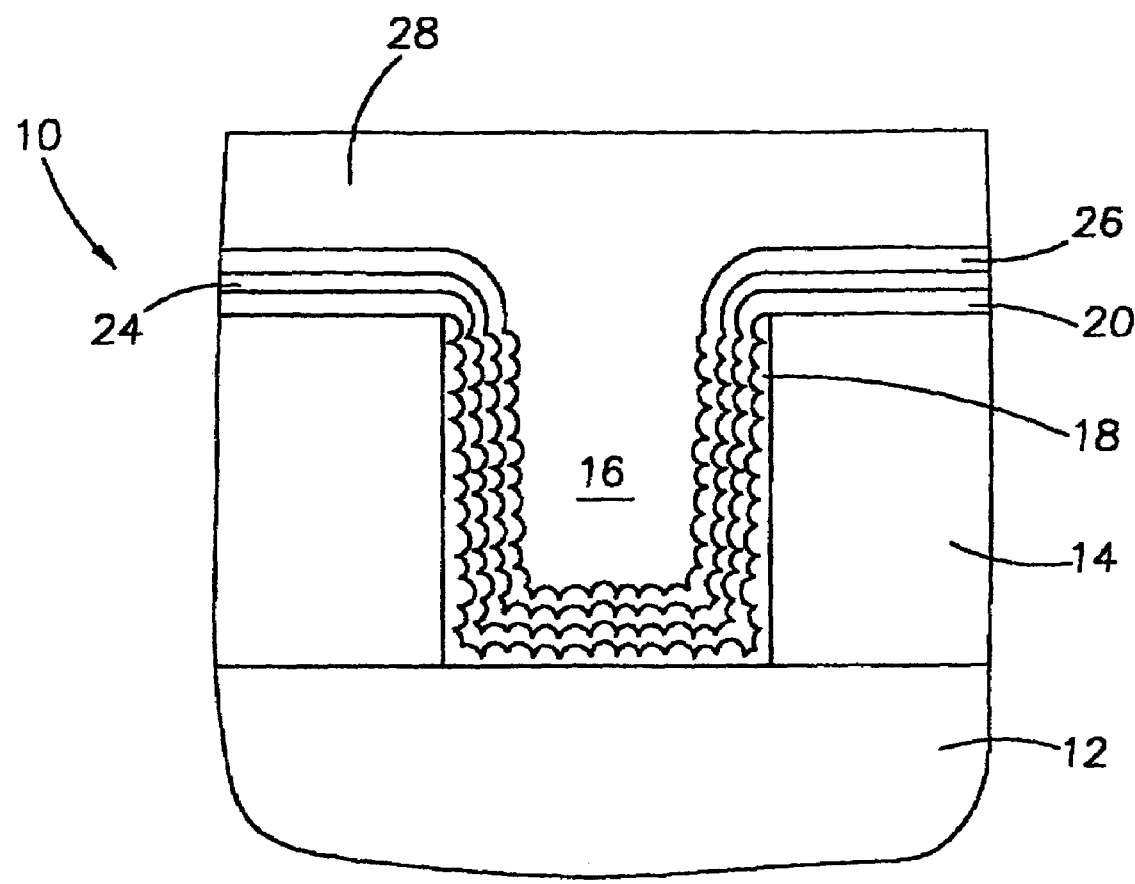

Referring now FIG. 5, a conductive material is then deposited over the dielectric layer 26 to form the top capacitor electrode (plate) 28 and complete the capacitor structure. The top electrode 28 can be formed by conventional techniques from a conductive material such as doped polysilicon or a conductive metal such as tungsten, tungsten nitride, titanium nitride, and platinum. The conductive material can be deposited on the dielectric layer 26 by conventional methods, such as CVD, or physical vapor deposition (e.g., sputtering) for a metal plate, to complete the capacitor structure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor, comprising:
  forming a first capacitor electrode comprising polysilicon over a substrate;
  forming an oxynitride layer over the first capacitor electrode by annealing the first capacitor electrode in the presence of nitric oxide, wherein a layer of nitrogen is formed at an interface between the first capacitor electrode and the oxynitride layer;
  after completing said annealing the first capacitor electrode in the presence of nitric oxide, nitridizing the oxynitride layer in a nitrogen-containing gas to form a nitride layer on a top surface of the oxynitride layer; and
  forming a dielectric material over the oxynitride layer.

2. The method of claim 1, wherein the dielectric material comprises a high K dielectric.

3. The method of claim 2, wherein the dielectric material is selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

4. The method of claim 2, further comprising, after forming the dielectric layer, annealing the dielectric material in an oxidizing gas.

5. The method of claim 1, wherein the oxynitride layer is nitridized in an activated nitrogen-containing gas.

6. A method of forming a capacitor, comprising:
forming an oxynitride layer over a lower electrode by annealing the lower electrode in the presence of nitric oxide wherein a layer of nitrogen is formed at an interface between the lower electrode and the oxynitride layer, the lower electrode comprising polysilicon within an opening in an insulating layer overlying a substrate, the lower electrode in contact with an active area in said substrate;
after completing said annealing the lower electrode in the presence of nitric oxide, nitridizing the oxynitride layer in a nitrogen-containing gas to form a nitride layer on a top surface of the oxynitride layer;
forming a high K dielectric layer over the oxynitride layer; and
annealing the high K dielectric layer in an oxidizing gas.

7. The method of claim 6, wherein forming the oxynitride layer comprises:
annealing the lower electrode in the presence of nitric oxide at a temperature of less than 800° C. to form an oxynitride layer having a thickness about 40 angstroms or less.

8. A method of forming a capacitor in a semiconductor device, comprising:
forming a first electrode layer within an opening in an insulating material; the first electrode layer comprising hemispherical grain polysilicon;
forming a thin layer of oxynitride over the first electrode layer by annealing the first electrode layer in the presence of nitric oxide wherein a layer of nitrogen is formed at an interface between the first electrode layer and the oxynitride layer;
after completing said annealing the first electrode layer in the presence of nitric oxide, nitridizing the oxynitride layer in a nitrogen-containing gas to form a nitride layer on a top surface of the oxynitride layer;
forming an insulative layer over the oxynitride layer; the insulative layer comprising an insulating inorganic metal oxide material; and
forming a second conductive electrode layer over the insulative layer.

9. A method of forming a capacitor, comprising:
forming a first electrode over a substrate, the first electrode comprising polysilicon;
exposing the first electrode to nitric oxide at a temperature of less than about 800° C. to form an oxynitride layer thereon having a thickness of about 40 angstroms or less and a layer of nitrogen at an interface between the first electrode and the oxynitride layer; and
after completing said exposing the first electrode to nitric oxide, exposing the oxynitride layer to a nitrogen gas to nitridize the oxynitride layer to form a nitride layer on a top surface of the oxynitride layer;
wherein the nitrogen layer is effective to inhibit oxygen diffusion through the oxynitride layer into the first electrode.

10. A method of forming a capacitor, comprising:
forming a first electrode over a substrate, the first electrode comprising polysilicon;
thermally annealing the first electrode in the presence of nitric oxide at a temperature of less than about 800° C. to form an oxynitride layer thereon having a thickness of less than about 15 angstroms and a layer of nitrogen at an interface between the first electrode and the oxynitride layer; and
after completing said exposing the first electrode to nitric oxide, annealing the oxynitride layer in a nitrogen gas to nitridize the oxynitride layer to form a nitride layer on a top surface of the oxynitride layer;
wherein the nitrogen layer is effective to inhibit oxidation of the first electrode.

11. A method of forming a capacitor, comprising:
exposing a polysilicon electrode to nitric oxide at a temperature of less than about 800° C. to form an oxynitride layer thereon having a thickness of about 40 angstroms or less and a layer of nitrogen at an interface between the polysilicon electrode and the oxynitride layer; and
after completing said exposing the polysilicon electrode to nitric oxide, exposing the oxynitride layer to a nitrogen gas to nitridize the oxynitride layer to form a nitride layer on a top surface of the oxynitride layer;
wherein the nitrogen layer is effective to inhibit oxidation of the polysilicon electrode.

12. A method of forming a capacitor, comprising:
thermally annealing a polysilicon electrode in the presence of nitric oxide at a temperature of less than about 800° C. to form an oxynitride layer thereon having a thickness of about 40 angstroms or less and a layer of nitrogen at an interface between the polysilicon electrode and the oxynitride layer;
after completing said thermally annealing the polysilicon electrode in the presence of nitric oxide, annealing the oxynitride layer in a nitrogen gas to nitridize the oxynitride layer to form a nitride layer on a top surface of the oxynitride layer;
forming a high K dielectric layer over the nitridized oxynitride layer;
annealing the high K dielectric layer in an oxidizing gas, wherein oxidation of the polysilicon electrode is inhibited; and
forming a second electrode over the high K dielectric layer, the second electrode comprising a conductive material.

13. A method of forming a capacitor, comprising:
forming a first electrode within one or more openings in an insulative layer situated on a substrate, said one or more openings extending to said substrate, and the first electrode comprising polysilicon;
thermally annealing the first electrode in the presence of nitric oxide at a temperature of less than about 800° C. to form an oxynitride layer thereon having a thickness of about 40 angstroms or less and a layer of nitrogen at an interface between the first electrode and the oxynitride layer;
after completing said thermally annealing the first electrode in the presence of nitric oxide, annealing the oxynitride layer in a nitrogen gas to nitridize the oxynitride layer to form a nitride layer on a top surface of the oxynitride layer;
forming a high K dielectric layer over the nitridized oxynitride layer;
annealing the high K dielectric layer in an oxidizing gas, wherein oxidation of the first electrode is inhibited; and
forming a second electrode over the high K dielectric layer, the second electrode comprising a conductive material.

14. A method of forming a capacitor, comprising:
forming an oxynitride layer having a thickness of about 40 angstroms or less over a lower capacitor electrode and a layer of nitrogen at an interface between the lower capacitor electrode and the oxynitride layer by annealing the lower capacitor electrode in the presence of nitric oxide, the lower electrode comprising polysilicon and within an opening in an insulative material;
after completing said annealing the lower capacitor electrode in the presence of nitric oxide, nitridizing the oxynitride layer in a nitrogen containing gas to form a nitride layer on a top surface of the oxynitride layer; and
forming a high K dielectric layer over the oxynitride layer.

15. The method of claim 14, further comprising oxygen annealing the high K dielectric layer.

16. A method of forming a capacitor, comprising:
annealing a polysilicon electrode in nitric oxide to form an oxynitride layer over the polysilicon electrode and a layer of nitrogen at an interface between the polysilicon electrode and the oxynitride layer;
after completing said annealing the polysilicon electrode in nitric oxide, annealing the oxynitride layer in a nitrogen gas to form a nitridized oxynitride layer on a top surface of the oxynitride layer having a thickness of about 40 angstroms or less; and
forming a high K dielectric layer over the nitridized oxynitride layer.

17. A method of forming a capacitor, comprising:
annealing a polysilicon electrode in nitric oxide to form an oxynitride layer of about 40 angstroms or less over the polysilicon electrode and a layer of nitrogen at an interface between the polysilicon electrode and the oxynitride layer;
after completing said annealing the polysilicon electrode in nitric oxide, thermally annealing the oxynitride layer in a nitrogen gas to nitridize the oxynitride layer to form a nitride layer on a top surface of the oxynitride layer; and
forming a high K dielectric layer over the nitridized oxynitride layer.

18. A method of forming a capacitor, comprising:
exposing a polysilicon electrode to nitric oxide at a temperature of less than about 800° C. to form an oxynitride layer of about 40 angstroms or less and a layer of nitrogen at an interface between the polysilicon electrode and the oxynitride layer;
after completing said exposing the polysilicon electrode to nitric oxide, exposing the oxynitride layer to a nitrogen-containing gas to nitridize the oxynitride layer to form a nitride layer on a top surface of the oxynitride layer;
forming a high K dielectric layer over the nitridized oxynitride layer; and
annealing the high K dielectric layer in an oxidizing gas.

19. A method of forming a capacitor, comprising:
annealing a polysilicon electrode in nitric oxide at a temperature of less than 800° C. to form an oxynitride layer over the polysilicon electrode and a layer of nitrogen at an interface between the polysilicon electrode and the oxynitride layer;
after completing said annealing the polysilicon electrode in nitric oxide, nitridizing the oxynitride layer to form a nitride layer on a top surface of the oxynitride layer; and
depositing a dielectric layer onto the nitride layer.

20. A method of forming a capacitor, comprising:
annealing a polysilicon electrode in nitric oxide to form an oxynitride layer over the polysilicon electrode and a layer of nitrogen at an interface between the polysilicon electrode and the oxynitride layer;
after completing said annealing the polysilicon electrode in nitric oxide, nitridizing the oxynitride layer to form a nitride on a top surface of the oxynitride layer; and
depositing a high K dielectric layer onto the nitride layer.

21. A method of forming a capacitor, comprising:
heat treating a polysilicon electrode in nitric oxide to form an oxynitride layer over the polysilicon electrode and a layer of nitrogen at an interface between the polysilicon electrode and the oxynitride layer;
after completing said heating the polysilicon electrode in nitric oxide, exposing the oxynitride layer to a nitrogen-containing gas to form a nitride on a top surface of the oxynitride layer; and
forming a high K dielectric layer over the nitride layer.

22. A method of forming a capacitor, comprising:
annealing an HSG polysilicon electrode in nitric oxide at a temperature of about 700° C. to about 750° C. to form an oxynitride layer having a thickness of about 40 angstroms or less and a layer of nitrogen at an interface between the HSG polysilicon electrode and the oxynitride layer;
after completing said annealing the HSG polysilicon electrode in nitric oxide, exposing the oxynitride layer to a nitrogen-containing gas to form a nitrided oxide layer on a top surface of the oxynitride layer;
forming a layer comprising tantalum pentoxide over the nitrided oxide layer; and
annealing the tantalum pentoxide layer in an oxidizing ambient;
whereby the thickness of the nitrided oxide layer is about 40 angstroms or less.

23. A method of forming a capacitor, comprising:
annealing a polysilicon electrode in nitric oxide to form an oxynitride layer on the polysilicon electrode and a layer of nitrogen at an interface between the polysilicon electrode and the oxynitride layer;
after completing said annealing the polysilicon electrode in nitric oxide, annealing the oxynitride layer in a nitrogen gas to nitridize the oxynitride layer to form a nitride layer on a top surface of the oxynitride layer;
forming a dielectric layer over the nitride layer; and
exposing the dielectric layer to an oxidizing gas whereupon oxidation of the polysilicon electrode is inhibited.

24. A method of forming a capacitor, comprising:
annealing a polysilicon electrode in nitric oxide to form an oxynitride layer on the polysilicon electrode and a layer of nitrogen at an interface between the polysilicon electrode and the oxynitride layer; and
after completing said annealing the polysilicon electrode in nitric oxide, plasma annealing the oxynitride layer in a nitrogen gas to form a nitride layer on a top surface of the oxynitride layer wherein oxidation of the polysilicon electrode is inhibited.

25. A method of forming a capacitor, comprising:
annealing a polysilicon electrode in nitric oxide to form an oxynitride layer on the polysilicon electrode and a layer of nitrogen at an interface between the polysilicon electrode and the oxynitride layer;
after completing said annealing the polysilicon electrode in nitric oxide, plasma annealing the oxynitride layer in a nitrogen gas to form a nitride layer on a top surface of the oxynitride layer; and
forming a dielectric layer over the nitride layer, wherein oxidation of the polysilicon electrode is inhibited.

* * * * *